(12) United States Patent
Im

(10) Patent No.: US 8,802,580 B2
(45) Date of Patent: Aug. 12, 2014

(54) SYSTEMS AND METHODS FOR THE CRYSTALLIZATION OF THIN FILMS

(75) Inventor: James S. Im, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 461 days.

(21) Appl. No.: 13/129,219

(22) PCT Filed: Nov. 13, 2009

(86) PCT No.: PCT/US2009/064381
§ 371 (c)(1),
(2), (4) Date: Sep. 1, 2011

(87) PCT Pub. No.: WO2010/056990
PCT Pub. Date: May 20, 2010

(65) Prior Publication Data
US 2011/0309370 A1 Dec. 22, 2011

Related U.S. Application Data

(60) Provisional application No. 61/114,766, filed on Nov. 14, 2008.

(51) Int. Cl.
*H01L 21/00* (2006.01)
(52) U.S. Cl.
USPC 438/795; 257/75; 257/E21.347; 257/E29.003; 219/121.6
(58) Field of Classification Search
USPC ............. 257/75, E21.347, E29.003; 438/795; 219/121.6
See application file for complete search history.

(56) References Cited

U.S. PATENT DOCUMENTS 3,632,205 A * 1/1972 Marcy .............................. 355/53
4,234,358 A * 11/1980 Celler et al. ..................... 117/41
(Continued)

FOREIGN PATENT DOCUMENTS

| CN | 1495848 A | 5/2004 |
| CN | 101111925 A | 1/2008 |

(Continued)

OTHER PUBLICATIONS

Bergmann, R. et al., "Nucleation and Growth of Crystalline Silicon Films on Glass for Solar Cells," Phys. Stat. Sol., 1998, pp. 587-602, vol. 166, Germany.

(Continued)

*Primary Examiner* — Kimberly Rizkallah
*Assistant Examiner* — Caleb Henry
(74) *Attorney, Agent, or Firm* — Wilmer Cutler Pickering Hale and Dorr LLP

(57) ABSTRACT

Crystallization of thin films using pulsed irradiation The method includes continuously irradiating a film having an x-axis and a y-axis, in a first scan in the x-direction of the film with a plurality of line beam laser pulses to form a first set of irradiated regions, translating the film a distance in the y-direction of the film, wherein the distance is less than the length of the line beam, and continuously irradiating the film in a second scan in the negative x-direction of the film with a sequence of line beam laser pulses to form a second set of irradiated regions, wherein each of the second set of irradiated regions overlaps with a portion of the first set of irradiated regions, and wherein each of the first and the second set of irradiated regions upon cooling forms one or more crystallized regions.

17 Claims, 9 Drawing Sheets

(56) References Cited

U.S. PATENT DOCUMENTS

| | | | |
|---|---|---|---|
| 4,309,225 A * | 1/1982 | Fan et al. | 438/72 |
| 4,382,658 A | 5/1983 | Shields et al. | |
| 4,456,371 A | 6/1984 | Lin | |
| 4,639,277 A | 1/1987 | Hawkins | |
| 4,691,983 A | 9/1987 | Kobayashi et al. | |
| 4,727,047 A | 2/1988 | Bozler et al. | |
| 4,758,533 A | 7/1988 | Magee et al. | |
| 4,793,694 A * | 12/1988 | Liu | 359/489.07 |
| 4,800,179 A | 1/1989 | Mukai et al. | |
| 4,855,014 A | 8/1989 | Kakimoto et al. | |
| 4,870,031 A | 9/1989 | Sugahara et al. | |
| 4,940,505 A | 7/1990 | Schachameyer et al. | |
| 4,970,546 A | 11/1990 | Suzuki et al. | |
| 4,977,104 A | 12/1990 | Sawada et al. | |
| 5,032,233 A | 7/1991 | Yu et al. | |
| 5,061,655 A | 10/1991 | Ipposhi et al. | |
| 5,076,667 A | 12/1991 | Stewart | |
| RE33,836 E | 3/1992 | Resor, III et al. | |
| 5,145,808 A | 9/1992 | Sameshima et al. | |
| 5,173,441 A | 12/1992 | Yu et al. | |
| 5,204,659 A | 4/1993 | Sarma | |
| 5,233,207 A | 8/1993 | Anzai et al. | |
| 5,247,375 A | 9/1993 | Mochizuki | |
| 5,281,840 A | 1/1994 | Sarma | |
| 5,285,236 A | 2/1994 | Jain | |
| 5,291,240 A | 3/1994 | Jain | |
| 5,294,811 A | 3/1994 | Aoyama et al. | |
| 5,304,357 A | 4/1994 | Sato et al. | |
| 5,338,959 A | 8/1994 | Kim et al. | |
| 5,373,803 A | 12/1994 | Noguchi et al. | |
| 5,395,481 A | 3/1995 | McCarthy | |
| 5,409,867 A | 4/1995 | Asano et al. | |
| 5,453,594 A | 9/1995 | Konecny | |
| 5,456,763 A | 10/1995 | Kaschmitter et al. | |
| 5,496,768 A | 3/1996 | Kudo et al. | |
| 5,512,494 A | 4/1996 | Tanabe et al. | |
| 5,523,193 A | 6/1996 | Nelson | |
| 5,529,951 A | 6/1996 | Noguchi et al. | |
| 5,571,430 A | 11/1996 | Kawasaki et al. | |
| 5,591,668 A | 1/1997 | Maegawa et al. | |
| 5,663,579 A | 9/1997 | Noguchi | |
| 5,683,935 A | 11/1997 | Miyamoto | |
| 5,710,050 A | 1/1998 | Makita et al. | |
| 5,721,606 A | 2/1998 | Jain | |
| 5,742,426 A | 4/1998 | York | |
| 5,756,364 A | 5/1998 | Tanaka et al. | |
| 5,766,989 A | 6/1998 | Maegawa et al. | |
| 5,767,003 A | 6/1998 | Noguchi | |
| 5,817,548 A | 10/1998 | Noguchi et al. | |
| 5,844,588 A | 12/1998 | Anderson | |
| 5,858,807 A | 1/1999 | Kawamura | |
| 5,861,991 A | 1/1999 | Fork | |
| 5,893,990 A | 4/1999 | Tanaka et al. | |
| 5,948,291 A | 9/1999 | Neylan et al. | |
| 5,960,323 A | 9/1999 | Wakita et al. | |
| 5,986,807 A | 11/1999 | Fork | |
| 6,002,523 A | 12/1999 | Tanaka | |
| 6,014,944 A | 1/2000 | Aklufi et al. | |
| 6,020,224 A | 2/2000 | Shimogaichi et al. | |
| 6,020,244 A | 2/2000 | Thompson et al. | |
| 6,045,980 A | 4/2000 | Edelkind et al. | |
| 6,072,631 A | 6/2000 | Guenther et al. | |
| 6,081,381 A | 6/2000 | Shalapenok et al. | |
| 6,117,752 A | 9/2000 | Suzuki et al. | |
| 6,120,976 A | 9/2000 | Treadwell et al. | |
| 6,130,009 A | 10/2000 | Smith et al. | |
| 6,130,455 A | 10/2000 | Yoshinouchi et al. | |
| 6,135,632 A | 10/2000 | Flint | |
| 6,136,632 A | 10/2000 | Higashi | |
| 6,156,997 A | 12/2000 | Yamazaki et al. | |
| 6,162,711 A | 12/2000 | Ma et al. | |
| 6,169,014 B1 | 1/2001 | McCulloch et al. | |
| 6,172,820 B1 | 1/2001 | Kuwahara et al. | |
| 6,176,922 B1 | 1/2001 | Aklufi et al. | |
| 6,177,301 B1 | 1/2001 | Jung et al. | |
| 6,184,490 B1 | 2/2001 | Schweizer | |
| 6,187,088 B1 | 2/2001 | Okumura et al. | |
| 6,190,985 B1 | 2/2001 | Buynoski | |
| 6,193,796 B1 | 2/2001 | Yang et al. | |
| 6,203,952 B1 | 3/2001 | O'Brien et al. | |
| 6,235,614 B1 | 5/2001 | Yang et al. | |
| 6,242,291 B1 | 6/2001 | Kusumoto et al. | |
| 6,274,488 B1 | 8/2001 | Talwar et al. | |
| 6,285,001 B1 | 9/2001 | Fleming et al. | |
| 6,300,175 B1 | 10/2001 | Moon et al. | |
| 6,313,435 B1 | 11/2001 | Shoemaker et al. | |
| 6,316,338 B1 | 11/2001 | Jung et al. | |
| 6,320,227 B1 | 11/2001 | Lee et al. | |
| 6,322,625 B2 | 11/2001 | Im | |
| 6,326,186 B1 | 12/2001 | Kirk et al. | |
| 6,326,215 B1 | 12/2001 | Keen | |
| 6,326,286 B1 | 12/2001 | Park et al. | |
| 6,333,232 B1 | 12/2001 | Kunikiyo et al. | |
| 6,341,042 B1 | 1/2002 | Matsunaka et al. | |
| 6,348,990 B1 | 2/2002 | Igasaki et al. | |
| 6,353,218 B1 | 3/2002 | Yamazaki et al. | |
| 6,358,784 B1 | 3/2002 | Zhang et al. | |
| 6,368,945 B1 | 4/2002 | Im | |
| 6,388,146 B1 | 5/2002 | Onishi et al. | |
| 6,388,386 B1 | 5/2002 | Kunii et al. | |
| 6,392,810 B1 | 5/2002 | Tanaka et al. | |
| 6,393,042 B1 | 5/2002 | Tanaka et al. | |
| 6,407,012 B1 | 6/2002 | Miyasaka et al. | |
| 6,410,373 B1 | 6/2002 | Chang et al. | |
| 6,429,100 B2 | 8/2002 | Yoneda et al. | |
| 6,432,758 B1 | 8/2002 | Cheng et al. | |
| 6,437,284 B1 | 8/2002 | Okamoto et al. | |
| 6,444,506 B1 | 9/2002 | Kusumoto et al. | |
| 6,445,359 B1 | 9/2002 | Ho | |
| 6,448,612 B1 | 9/2002 | Miyazaki et al. | |
| 6,451,631 B1 | 9/2002 | Grigoropoulos et al. | |
| 6,455,359 B1 | 9/2002 | Yamazaki et al. | |
| 6,468,845 B1 | 10/2002 | Nakajima et al. | |
| 6,471,772 B1 | 10/2002 | Tanaka | |
| 6,472,684 B1 | 10/2002 | Yamazaki et al. | |
| 6,476,447 B1 | 11/2002 | Yamazaki et al. | |
| 6,479,837 B1 | 11/2002 | Ogawa et al. | |
| 6,482,722 B2 | 11/2002 | Kunii et al. | |
| 6,493,042 B1 | 12/2002 | Bozdagi et al. | |
| 6,495,067 B1 | 12/2002 | Ono et al. | |
| 6,495,405 B2 | 12/2002 | Voutsas et al. | |
| 6,501,095 B2 | 12/2002 | Yamaguchi et al. | |
| 6,504,175 B1 | 1/2003 | Mei et al. | |
| 6,506,636 B2 | 1/2003 | Yamazaki et al. | |
| 6,511,718 B1 | 1/2003 | Paz de Araujo et al. | |
| 6,512,634 B2 | 1/2003 | Tanaka et al. | |
| 6,516,009 B1 | 2/2003 | Tanaka et al. | |
| 6,521,492 B2 | 2/2003 | Miyasaka et al. | |
| 6,526,585 B1 | 3/2003 | Hill | |
| 6,528,359 B2 | 3/2003 | Kusumoto et al. | |
| 6,531,681 B1 | 3/2003 | Markle et al. | |
| 6,535,535 B1 | 3/2003 | Yamazaki et al. | |
| 6,555,422 B1 | 4/2003 | Yamazaki et al. | |
| 6,555,449 B1 | 4/2003 | Im et al. | |
| 6,563,077 B2 | 5/2003 | Im | |
| 6,573,163 B2 | 6/2003 | Voutsas et al. | |
| 6,573,531 B1 | 6/2003 | Im et al. | |
| 6,577,380 B1 | 6/2003 | Sposili et al. | |
| 6,582,827 B1 | 6/2003 | Im | |
| 6,590,228 B2 | 7/2003 | Voutsas et al. | |
| 6,608,326 B1 | 8/2003 | Shinagawa et al. | |
| 6,621,044 B2 | 9/2003 | Jain et al. | |
| 6,635,554 B1 | 10/2003 | Im et al. | |
| 6,635,932 B2 | 10/2003 | Grigoropoulos et al. | |
| 6,639,728 B2 * | 10/2003 | Murra et al. | 359/623 |
| 6,667,198 B2 | 12/2003 | Shimoto et al. | |
| 6,693,258 B2 | 2/2004 | Sugano et al. | |
| 6,734,635 B2 | 5/2004 | Kunii et al. | |
| 6,741,621 B2 | 5/2004 | Asano | |
| 6,750,424 B2 | 6/2004 | Tanaka | |
| 6,755,909 B2 | 6/2004 | Jung | |
| 6,784,455 B2 | 8/2004 | Maekawa et al. | |
| 6,830,993 B1 | 12/2004 | Im et al. | |
| 6,858,477 B2 | 2/2005 | Deane et al. | |

(56) References Cited

U.S. PATENT DOCUMENTS

| | | |
|---|---|---|
| 6,908,835 B2 | 6/2005 | Sposili et al. |
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2 | 1/2007 | Im et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2 | 5/2007 | Im et al. |
| 7,297,982 B2 | 11/2007 | Suzuki et al. |
| 7,311,778 B2 | 12/2007 | Im et al. |
| 7,318,866 B2 | 1/2008 | Im |
| 7,323,368 B2 | 1/2008 | Takayama et al. |
| 7,326,876 B2 | 2/2008 | Jung |
| 7,364,952 B2 | 4/2008 | Im |
| 7,372,630 B2 * | 5/2008 | Tanaka ........................ 359/619 |
| 7,399,359 B2 | 7/2008 | Im et al. |
| 7,622,370 B2 | 11/2009 | Im |
| 7,629,234 B2 | 12/2009 | Bruland |
| 7,645,337 B2 | 1/2010 | Im et al. |
| 7,691,687 B2 | 4/2010 | Im |
| 7,700,462 B2 | 4/2010 | Tanaka et al. |
| 7,709,378 B2 | 5/2010 | Im |
| 7,804,647 B2 | 9/2010 | Mitani et al. |
| 7,964,480 B2 | 6/2011 | Im et al. |
| 2001/0001745 A1 | 5/2001 | Im et al. |
| 2001/0028925 A1 * | 10/2001 | Moshrefzadeh et al. ..... 427/552 |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0134765 A1 * | 9/2002 | Tanaka et al. ............. 219/121.6 |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1 | 3/2005 | Im |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2005/0282319 A1 | 12/2005 | Bruland et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0012664 A1 * | 1/2007 | Im ........................ 219/121.65 |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0054479 A1 * | 3/2007 | Tanaka ........................ 438/487 |
| 2007/0108472 A1 | 5/2007 | Jeong et al. |
| 2007/0111349 A1 | 5/2007 | Im |
| 2007/0145017 A1 | 6/2007 | Im et al. |
| 2007/0178631 A1 * | 8/2007 | Tanaka ........................ 438/166 |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 * | 5/2008 | Im ........................ 428/195.1 |
| 2008/0176414 A1 | 7/2008 | Im |
| 2008/0252978 A1 * | 10/2008 | Tanaka ........................ 359/577 |
| 2009/0001523 A1 | 1/2009 | Im |
| 2009/0045181 A1 * | 2/2009 | Im ........................ 219/121.76 |
| 2009/0127477 A1 * | 5/2009 | Tanaka ........................ 250/492.22 |
| 2009/0137105 A1 | 5/2009 | Im |
| 2009/0140173 A1 * | 6/2009 | Im ........................ 250/492.2 |
| 2009/0181552 A1 * | 7/2009 | Shimomura et al. ........ 438/795 |
| 2009/0218577 A1 | 9/2009 | Im |
| 2009/0242805 A1 * | 10/2009 | Im ........................ 250/492.2 |
| 2009/0309104 A1 | 12/2009 | Im et al. |
| 2010/0024865 A1 | 2/2010 | Shah et al. |
| 2010/0032586 A1 * | 2/2010 | Im et al. .................. 250/492.2 |
| 2010/0099273 A1 * | 4/2010 | Im ........................ 438/795 |
| 2010/0187529 A1 | 7/2010 | Im |
| 2011/0014780 A1 * | 1/2011 | Shimomura et al. ........ 438/479 |
| 2011/0201183 A1 * | 8/2011 | Moriwaka et al. .......... 438/487 |
| 2011/0248278 A1 * | 10/2011 | Im et al. ................... 257/66 |
| 2011/0309370 A1 | 12/2011 | Im |
| 2013/0009074 A1 * | 1/2013 | Im et al. ................... 250/453.11 |
| 2013/0012036 A1 * | 1/2013 | Im et al. ................... 438/795 |
| 2013/0071974 A1 * | 3/2013 | Im ........................ 438/166 |
| 2013/0105807 A1 * | 5/2013 | Im et al. ................... 257/66 |
| 2013/0161312 A1 * | 6/2013 | Im ........................ 219/385 |
| 2013/0201634 A1 * | 8/2013 | Im et al. ................... 361/748 |
| 2013/0280924 A1 * | 10/2013 | Im et al. ................... 438/795 |
| 2013/0316548 A1 * | 11/2013 | Im ........................ 438/795 |

(56) References Cited

U.S. PATENT DOCUMENTS

| | | | |
|---|---|---|---|
| 2014/0001164 A1* | 1/2014 | Im | 219/121.77 |
| 2014/0045347 A1* | 2/2014 | Im | 438/795 |

FOREIGN PATENT DOCUMENTS

| | | |
|---|---|---|
| CN | 101184871 A | 5/2008 |
| DE | 19839718 | 3/2000 |
| DE | 10103 670 A1 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | 9260681 A | 10/1997 |
| JP | H09-270393 | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 A | 3/1999 |
| JP | 11-281997 | 10/1999 |
| JP | H11-297852 | 10/1999 |
| JP | 11330000 A | 11/1999 |
| JP | 2000505241 A | 4/2000 |
| JP | 2000223425 | 8/2000 |
| JP | 2000-315652 | 11/2000 |
| JP | 2000346618 | 12/2000 |
| JP | 2001023920 A | 1/2001 |
| JP | 2002-353142 | 12/2002 |
| JP | 2002353159 A | 12/2002 |
| JP | 2003-031496 | 1/2003 |
| JP | 2003-509844 | 3/2003 |
| JP | 2003100653 | 4/2003 |
| JP | 2004031809 | 1/2004 |
| JP | 2004-311935 | 11/2004 |
| TW | 457553 B | 10/2001 |
| TW | 464960 A1 | 11/2001 |
| TW | 564465 A | 12/2003 |
| TW | 569350 B | 1/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-0231869 A2 | 4/2002 |
| WO | WO-02/42847 | 5/2002 |
| WO | WO-02/086954 A1 | 10/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017379 A3 | 2/2004 |
| WO | WO-2004/017380 | 2/2004 |
| WO | WO-2004/017381 | 2/2004 |
| WO | WO-2004/017382 A3 | 2/2004 |
| WO | WO-2004017380 A2 | 2/2004 |
| WO | WO-2004/075263 A3 | 9/2004 |
| WO | WO-2005/029546 A3 | 3/2005 |
| WO | WO-2005/029548 A3 | 3/2005 |
| WO | WO-2005/029550 A3 | 3/2005 |
| WO | WO-2005/029551 | 3/2005 |
| WO | WO-2006/055003 A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546-548 (1984).

Boyd, I. W., "Laser Processing of Thin Films and Microstructures, Oxidation, Deposition, and Etching of Insulators," Springer-Verlag BerlinHeidelber, 1987, 3 pages.

Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).

Brotherton et al., "Influence of Melt Depth in Laser Crystallized Poly-Si Thin Film Transistors," J. Appl. Phys., 82:4086-4094 (1997).

Brotherton, "Polycrystalline Silicon Thin Film Transistors," Semicond. Sci. Tech., 10:721-738 (1995).

Crowder et al., "Low-Temperature Single-Crystal Si TFT's Fabricated on Si Films processed via Sequential Lateral Solidification", IEEE Electron Device Letter, 19 (8): 306-308 (1998).

Crowder et al., "Parametric Investigation of SLS-processed Polysilicon Thin Films for TFT Application," Preparations and Characterization, Elsevier, Sequoia, NL, vol. 427, No. 1-2, Mar. 3, 2003, pp. 101-107, XP004417451.

Crowder et al., "Sequential Lateral Solidification of PECVD and Sputter Deposited a-Si Films", Mat. Res. Soc. Symp. Proc. 621:Q.9.7.1-9.7.6, 2000.

Dassow, R. et al., "Laser crystallizationof silicon for high-performance thin-film transistors," Semicond. Sci. Technol., 2000, pp. L31-L34, vol. 15, UK.

Dassow, R. et al., Laser-Crystallized Polycrystalline Silicon on Glass for Photovoltaic Applications, Solid State Phenomena, pp. 193-197, vols. 67-68, Scitec Publications, Switzerland.

Dassow, R. et al., "Nd:YVO4 Laser Crystallization for Thin Film Transistors with a High Mobility," Mat. Res. Soc. Symp. Proc., 2000, Q9.3.1-Q9.3.6, vol. 621, Materials Research Society.

Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobilityunder high normal field in thin-film transsitors, J. Appl. Phys. 73, 8402-8411 (1993).

Endert et al., "Excimer Laser: A New Tool for Precision Micromachining," Optical and Quantum Electronics, 27:1319-1335 (1995).

Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).

Geis et al., "Crystallographic orientation of silicon on an amorphous substrate using an artificial surface-relief grating and laser crystallization," Appl. Phys. Lett. 35(1) Jul. 1, 1979, 71-74.

Geis et al., "Silicon graphoepitaxy using a strip-heater oven," Appl. Phys. Lett. 37(5), Sep. 1, 1980, 454-456.

Geis et al., "Zone-Melting recrystallization of SI Films with a moveable-strip heater oven" J. Electro-Chem. Soc., 129: 2812-2818 (1982).

Gosain et al., "Formation of (100)-Textured Si Film Using an Excimer Laser on a Glass Substrate," Jpn. J. Appl. Phys., vol. 42 (2003), pp. L135-L137.

(56) References Cited

OTHER PUBLICATIONS

Gupta et al., "Numerical Analysis of Excimer-laser induced melting and solidification of Si Thin Films", Applied Phys. Lett., 71:99-101, 1997.
Hau-Riege et al., "The Effects Microstructural Transitions at Width Transitions on Interconnect reliability," Journal of Applied Physics, 87(12): 8467-8472.
Hawkins, W.G. et al., "Origin of lamellae in radiatively melted silicon films," Appl. Phys. Lett. 42(4), Feb. 15, 1983, pp. 358-360.
Hayzelden, C. and J.L. Batstone, Silicide formation and silicide-mediated crystallization of nickel-implanted amorphous silicon thin films, J. Appl. Phys. 73, 8279-8289 (1993).
Im et al., "Controlled Super-Lateral Growth of Si Films for Microstructural Manipulation and Optimization", Phys. Stat. Sol. (a), 166:603-617 (1998).
Im et al., "Crystalline Si Films for Integrated Active-Matrix Liquid-Crystals Displays," MRS Bulletin 21:39-48 (1996).
Im et al., "On the Super Lateral Growth Phenomenon Observed in Excimer Laser-Induced Crystallization of Thin Si Films," Appl. Phys. Lett., 64 (17): 2303-2305 (1994).
Im et al., "Phase Transformation Mechanisms Involved in Excimer Laser Crystallization of Amorphous Silicon Films," Appl. Phys. Lett., 63 (14):1969-1971 (1993).
Im et al., "Single-Crystal Si Films for Thin-Film Transistor Devices," Appl. Phys. Lett., 70(25):3434-3436 (1997).
Im, J.S., Method and system for producing crystalline thin films with a uniform crystalline orientation, U.S. Appl. No. 60/503,419.
Ishida et al., "Ultra-shallow boxlike profiles fabricated by pulsed ultraviolet-laser doping process", J. Vac. Sci. Technol. B 12(1): 399-404, (1994).
Ishihara et al., "A Novel Double-Pulse Exicem-Laser Crystallization Method of Silicon Thin-Films," Japanese Journal of Applied Physics, Publication Office Japanese Journal of Applied Physics, Tokyo, Japan, 34(8A):3976-3981 (1995).
Jeon et al., "Two-step laser recrystallization of poly-Si for effective control of grain boundaries", Journal of Non Crystalline Solids, 266-269: 645-649 (2000).
Jung, Y.H. et al., "Low Temperature Polycrystalline Si TFTs Fabricated with Directionally Crystallized Si Film," Mat. Res. Soc. Symp. Proc. vol. 621, Q8.3.1-6, 2000.
Jung, Y.H. et al., "The Dependence of Poly-Si TFT Characteristics on the Relative Misorientation Between Grain Boundaries and the Active Channel," Mat. Res. Soc. Symp. Proc., vol. 621, Q9.14.1-6, 2000.
Kahlert, H., "Creating Crystals," OE Magazine, Nov. 2001, 33-35.
Kim et al., "Grain Boundary Location-Controlled Poly-Si Films for TFT Devices Obtained Via Novel Excimer Laser Process," Mat. Res. Soc. Symp. Proc. vol. 358, 1995, pp. 903-908.
Kim et al., "Multiple Pulse Irradiation Effects in Excimer Laser-Induced Crystallization of Amorphous Si Films," Mat. Res. Soc. Sym. Proc., 321:665-670 (1994).
Kim, "Excimer-Laser-Induced Crystallization of Amorphous Silicon Thin Films", Ph. D. Dissertation Abstract, Columbia University, 1996, 198 pages.
Kim, C. et al., "Development of SLS-Based SOG Display," IDMC 2005, pp. 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993, pp. 703-708.
Kim, H.-J., et al., "The effects of dopants on surface-energy-driven secondary grain growth in silicon films," J. Appl. Phys. 67 (2), Jan. 15, 1990, pp. 757-767.
Kim, H.J. et al., "New Excimer-laser-crystallization method for producing large-grained and grain boundary-location-controlled Si Films for Thin Film Transistors", Applied Phys. Lett., 68: 1513-1515.
Kimura, M. and K. Egami, Influence of as-deposited film structure on (100) texture in laser-recrystallized silicon on fused quartz, Appl. Phys. Lett. 44, pp. 420-422 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., "Large-grained polycrystalline silicon on glass by copper vapor laser annealing," Thin Solid Films, 1999, pp. 129-132, vol. 337, Elsvier.
Kung, K.T.Y. and R. Reif, Implant-dose dependence of grain size and (110) texture enhancements in polycrystalline Si films by seed selection through ion channeling, J. Appl. Phys. 59, pp. 2422-2428 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683-685 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190-6195 (1993).
Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657-5662 (1994).
Lee, S.-W. and S.-K. Joo, Low temperature poly-Si thin-film transistor fabrication by metal-induced lateral crystallization, IEEE Electron Device Letters 17, 160-162 (1996).
Lee, S.-W., Y.-C. Jeon and S.-K. Joo, Pd induced lateral crystallization of amorphous Si thin films, Appl. Phys. Lett. 66, 1671-1673 (1995).
Leonard, J.P. et al, "Stochastic modeling of solid nucleation in supercooled liquids", Appl. Phys. Lett. 78:22, May 28, 2001, 3454-3456.
Limanov, A. et al., "Single-Axis Projection Scheme for Conducting Sequential Lateral Solidification of Si Films for Large-Area Electronics," Mat. Res. Soc. Symp. Proc., 2001, D10.1.1-D10.1.12, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 25-33, vol. 28, No. 1, Russia.
Limanov, A.B. et al., "Development of Linear Sequential Lateral Solidification Technique to Fabricate Quasi-Single-Crystal Superthin Si Films for High-Performance Thin Film Transistor Devices," Perspectives, Science, and Technologies for Novel Silicon on Insulator Devices, Eds. P.L.F. Hemment et al., Kluwer Academic Publishers 2000, pp. 55-61.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68:175-180(1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics,New York, US, 43(10): 946-948 (1983).
MICRO/LAS Lasersystem GMBH, "Overview of Beam Delivery Systems for Excimer Lasers," (1999), 21 pages.
MICRO/LAS Lasersystem GMBH, "UV Optics Systems for Excimer Laser Based Micromachining and Marking" (1999), 12 pages.
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944-946 (2002).
Miyata et al, "Low-Temperature Polycrystalline Silicon Thin-Film Transistors for Large-Area Liquid Crystal Display," Japanese J. of Applied Physics Part 1—Regular Papers Short Notes & Review Papers, 31:4559-62 (1992).
Nebel, "Laser Interference Structuring of A-SI:h" Amorphous Silicon Technology—1996, San Francisco, CA Apr. 8-12, Materials Research Society Symposium Proceedings, vol. 420, Pittsburgh, PA (1996), pp. 117-128.
Nerding, M., S. Christiansen, R. Dassow, K. Taretto, J.R. Kohler and H.P. Strunk, Tailoring texture in laser crystallization of silicon thin-films on glass, Solid State Phenom. 93, 173-178 (2003).

(56) References Cited

OTHER PUBLICATIONS

Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).

Ozawa et al., "Two-Dimensionally Position-Controlled Excimer-Laser-Crystallization of Silicon Thin Films on Glassy Substrate", Jpn. J. Appl. Phys. 38(10):5700-5705 (1999).

Sato et al., "Mobility anisotropy of electrons in inversion layers on oxidized silicon surfaces" Physical Review B (State) 4, pp. 1950-1960 (1971).

Smith, H.I. et al., "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.

Song et al., "Single Crystal Si Islands on SiO2 Obtained Via Excimer Laser Irradiation of a Patterned Si Film", Applied Phys. Lett., 68:3165-3167, 1996.

Sposili et al., "Line-scan sequential lateral solidification of Si thin films", Appl. Phys. A67, 273-6, 1998.

Sposili et al., "Sequential Lateral Solidification of Thin Silicon Films on SiO2", Appl. Phys. Lett., 69(19): 2864-2866 (1996).

Sposili et al., "Single-Crystal Si Films via a Low-Substrate-Temperature Excimer-Laser Crystallization Method", Mat. Res. Soc. Symp. Proc., 452: 953-958 (1997).

Thompson, C.V. and H.I. Smith, Surface-energy-driven secondary grain growth in ultrathin (<100 nm) films of silicon, Appl. Phys. Lett. 44, 603-605 (1984).

van der Wilt, P.C. et al., "State-of-the-Art Laser Crystallization of Si for Flat Panel Displays," PhAST, May 18, 2004, pp. 1-34.

van der Wilt, P.C. et al., "The Commercialization of the SLS Technology," Taiwan FPD, Jun. 11, 2004, pp. 1-12.

van der Wilt, P.C., "Textured poly-Si films for hybrid SLS," Jul. 2004, pp. 1-5.

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003, pp. 1494-1500.

Voutsas, A.T. et al., "A new era of crystallization: advances in polysilicon and crystal engineering," Applied Surface Science 250-262, 2003.

Voutsas, A.T. et al.: "Effect of process parameters on the structural characteristics of laterally grown, laser-annealed polycrystalline silicon films," Journal of applicaed Physics, vol. 94, No. 12, Dec. 15, 2003, pp. 7445-7452.

Watanabe et al., "Crystallization Process of Polycrystalline Silicon by KrF Excimer Laser Annealing," Japanese J. of Applied Physics Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997, pp. 1-6.

Werner, J.H. et al., "From polycrystalline to single crystalline silicon on glass," Thin Solid Films 383, 95-100, 2001.

White et al., "Characterization of thin-oxide MNOS memory transistors" IEEE Trans. Electron Devices ED-19, 1280-1288 (1972).

Yamauchi et al., "Polycrystalline silicon thin films processed with silicon ion implantation and subsequent solid-phase crystallization: Theory, experiments, and thin-film transistor applications" Journal of Applied Physics, 75(7):3235-3257 (1994).

Yoshimoto et al., "Excimer-Laser-Produced and Two-Dimensionally Position-Controlled Giant Si Grains on Organic SOG Underlayer", p. 285-286, AM-LCD (2000).

Brotherton, S.D., et al., Characterisation of poly-Si TFTs in Directionally Solidified SLS Si, Asia Display/IDW'01, p. 387-390.

International Search Report for corresponding International Patent Application No. PCT/US2010/033565, mailed Jul. 1, 2010, 1 page.

Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

International Search Report for corresponding International Patent Application No. PCT/US2010/055106, mailed Jan. 4, 2011, 1 page.

Andrä et al., "A new technology for crystalline silicon thin film solar cells on glass based on the laser crystallization," IEEE, pp. 217-220 (2000).

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

* cited by examiner

Random

Uniform

Directional

Single-crystal islands

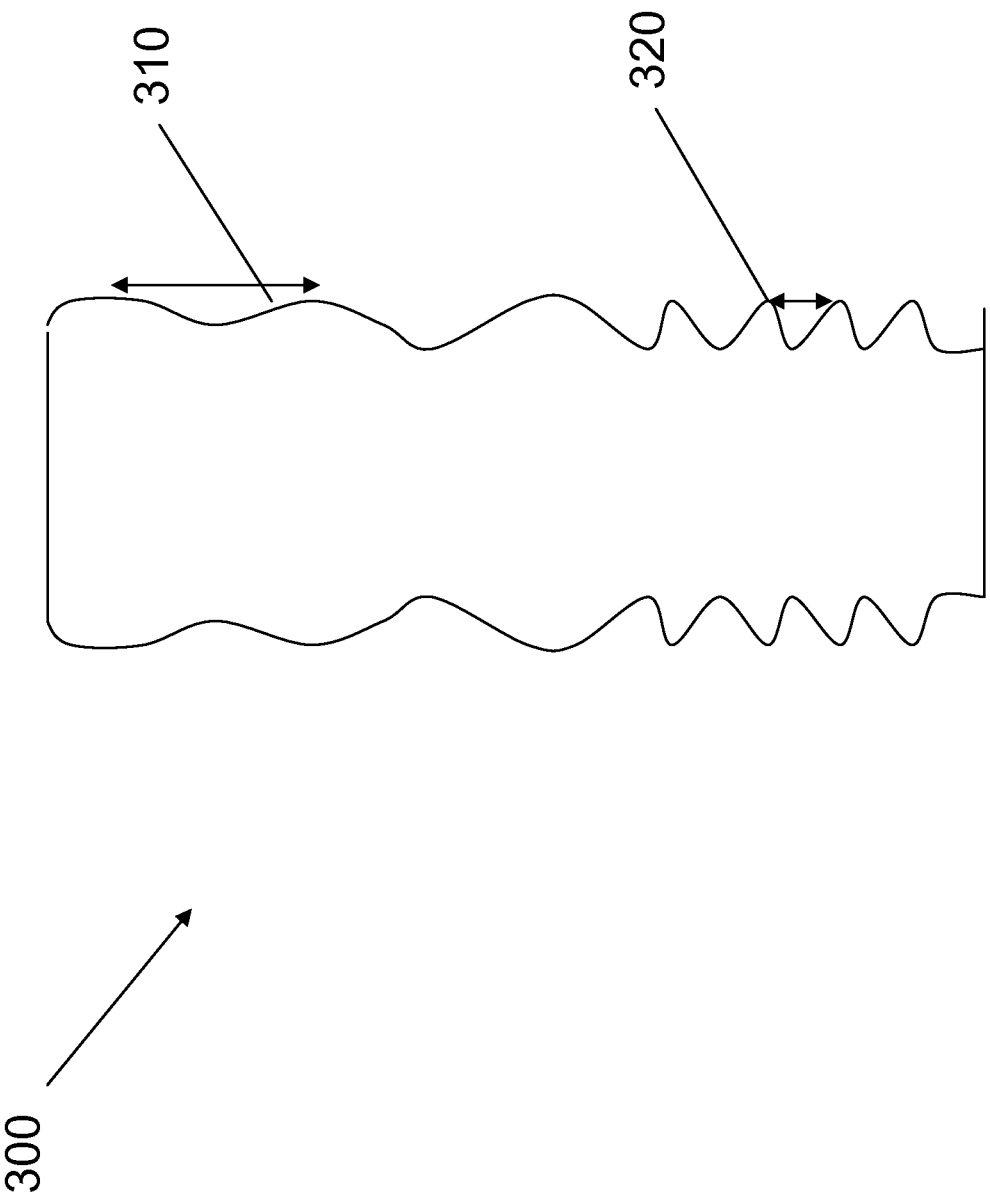

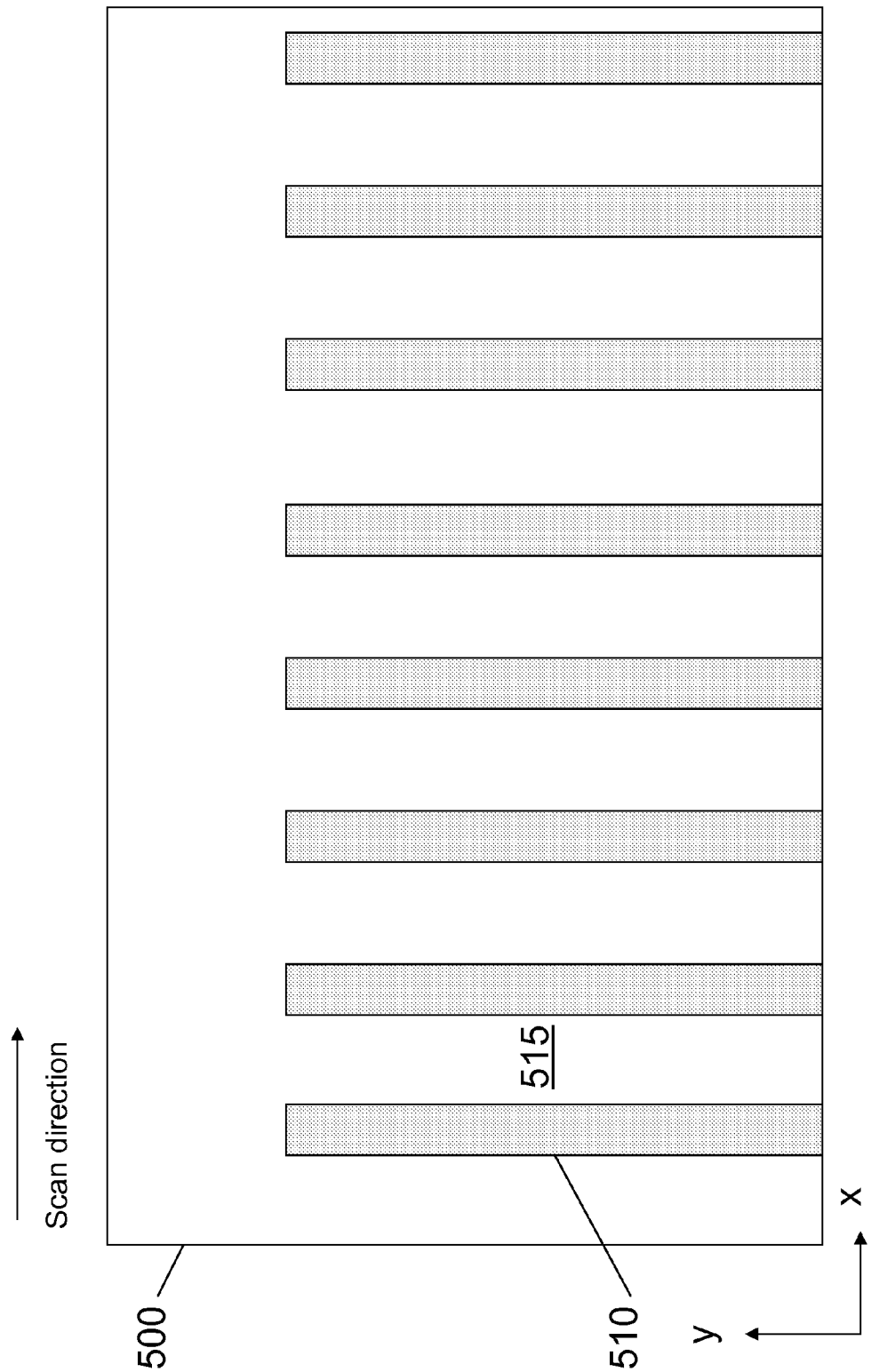

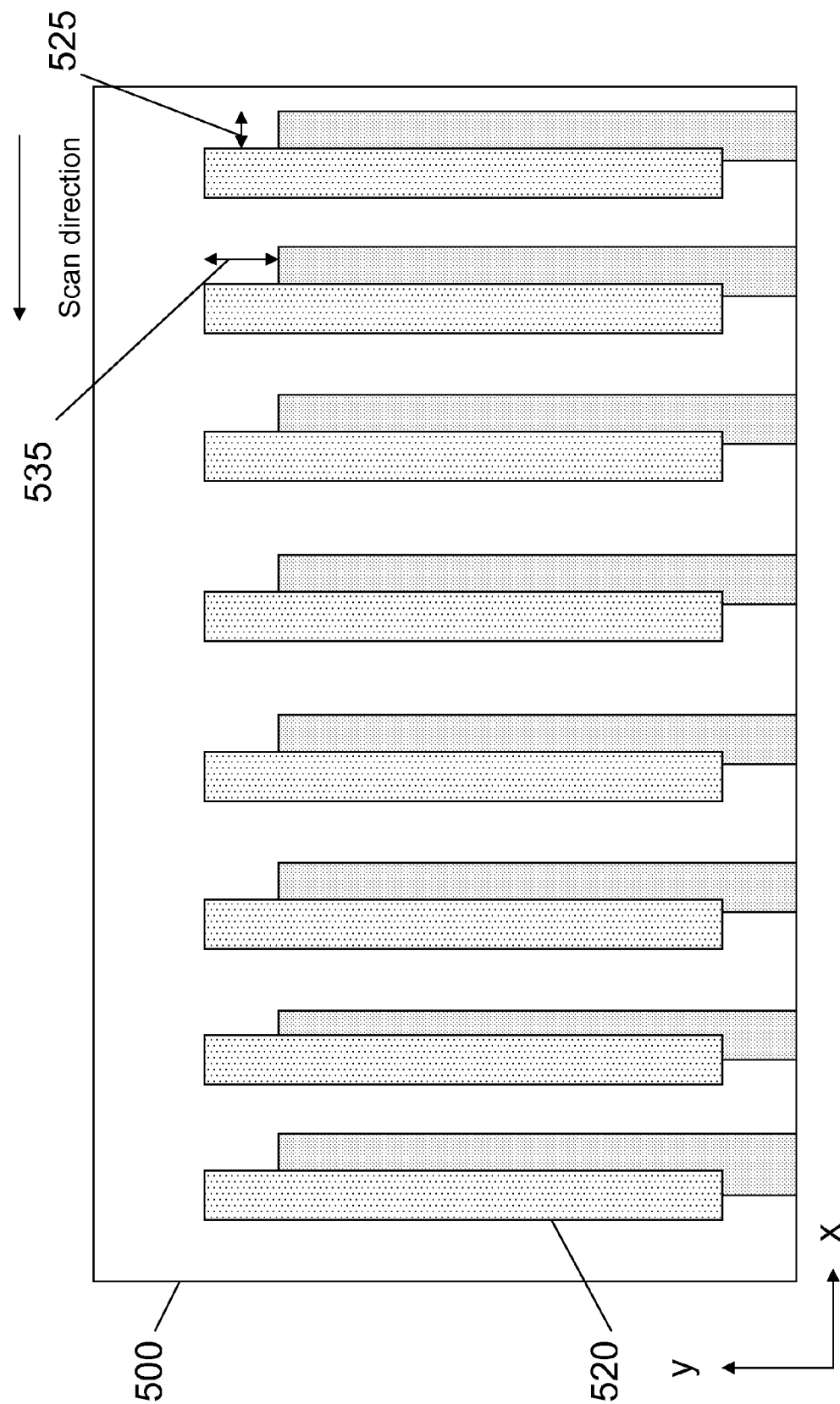

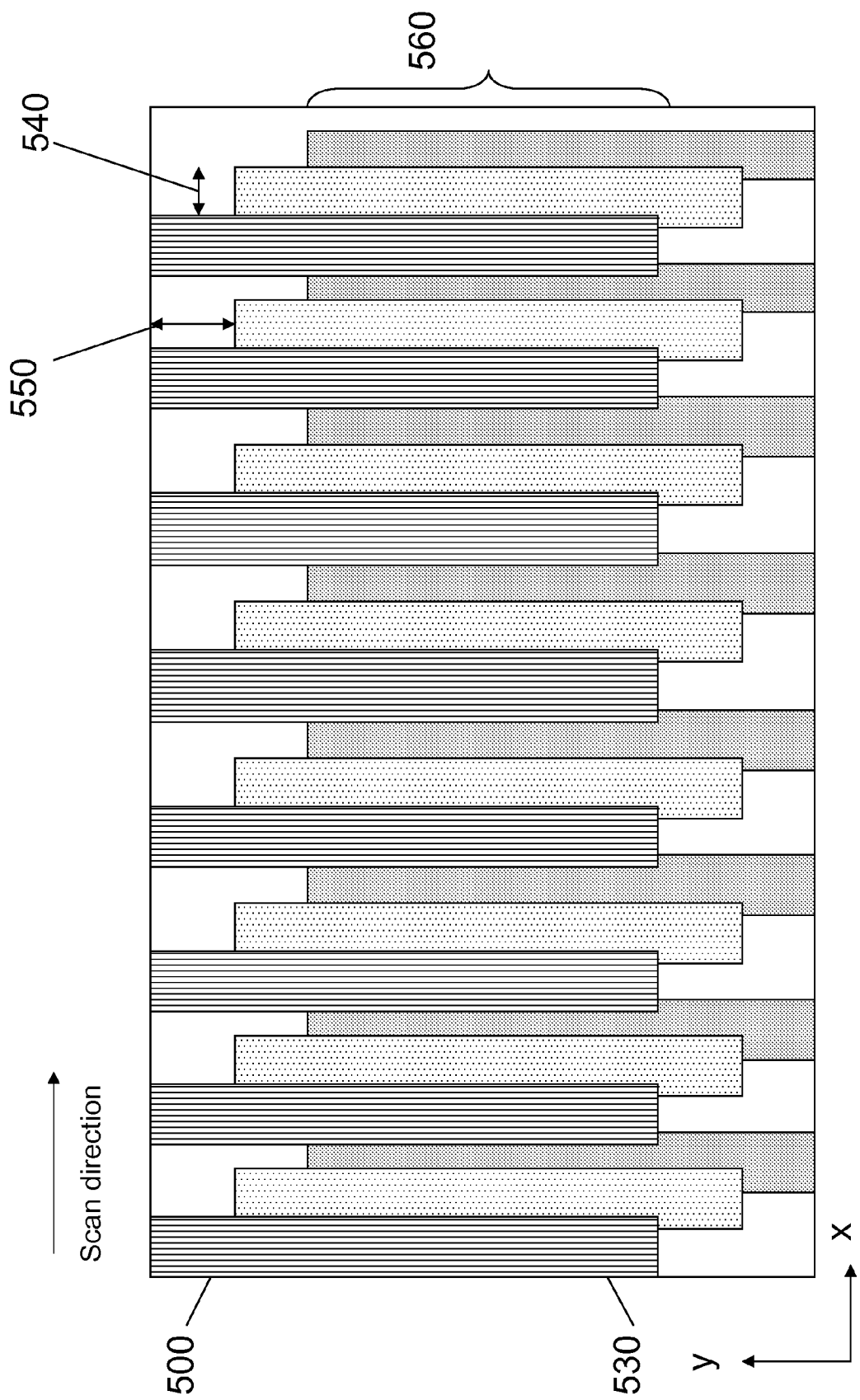

SYSTEMS AND METHODS FOR THE CRYSTALLIZATION OF THIN FILMS

RELATED APPLICATIONS

This application is a U.S. National Phase Application under 35 U.S.C. §371 of International Patent Application No. PCT/US2009/064381 filed Nov. 13, 2009, which claims priority under 35 U.S.C. §119(e) to U.S. application Ser. No. 61/114,766, entitled "Systems and Methods for the Crystallization of Thin Films," filed on Nov. 14, 2008, each of which is incorporated by reference herein in its entirety.

This application is related to co-pending, commonly owned U.S. application Ser. No. 11/293,655, filed Dec. 2, 2005, U.S. application Ser. No. 12/063,810, filed Feb. 14, 2008, and PCT Application Serial No. PCT/US08/77704, filed Sep. 25, 2008, all of which are incorporated by reference herein in their entireties.

FIELD

The disclosed subject matter generally relates to crystallization of thin films and particularly relates to crystallization of thin films using line beam pulsed laser irradiation.

BACKGROUND

In recent years, various techniques for crystallizing or improving the crystallinity of an amorphous or polycrystalline semiconductor film have been investigated. Such crystallized thin films may be used in the manufacture of a variety of devices, such as image sensors and active-matrix liquid-crystal display ("AMLCD") devices. In the latter, a regular array of thin-film transistors ("TFTs") is fabricated on an appropriate transparent substrate, and each transistor serves as a pixel controller.

Prior art methods for improving the crystallinity of the semiconductor film typically involve irradiating the thin film with a shaped laser beam. The shaped laser beam optimally should be a long line beam with a uniform width, a top-hat short axis profile, and uniform energy along its length. However, producing such a beam is challenging and most line-beams will have non-uniformities along the length of the beam, while the cross-section of the beam is more rounded or, in some instances, Gaussian. The non-uniformities can have random and periodic components (hereinafter referred to as "random non-uniformities" and "periodic non-uniformities", respectively). These non-uniformities in the laser beam can translate to non-uniformities in the film, which results in non-uniformities in the devices implementing the films, for example, non-uniformities in the brightness of a display in a AMLCD application.

SUMMARY

The application describes systems and methods for the crystallization of thin films using pulsed irradiation of a long, narrow beam shape that is continuously advanced over the film surface. The methods provide crystallized films in which variations in the quality and performance of the crystallized regions is reduced.

In one aspect, the application describes a method of processing a film. The method includes continuously irradiating a film having an x-axis and a y-axis, in a first scan in the x-direction of the film with a plurality of line beam laser pulses to form a first set of irradiated regions; translating the film a distance in the y-direction of the film, wherein the distance is less than the length of the line beam; and continuously irradiating the film in a second scan in the negative x-direction of the film with a sequence of line beam laser pulses to form a second set of irradiated regions, wherein each of the second set of irradiated regions overlaps with a portion of the first set of irradiated regions, and wherein each of the first and the second set of irradiated regions upon cooling forms one or more crystallized regions.

In any of the foregoing embodiments, each line beam laser pulse has a fluence that is sufficient to melt the film throughout its thickness in the first and second set irradiated regions, and wherein each of the first set of irradiated regions are spaced-apart from each other.

In any of the foregoing embodiments, each of the first set of irradiated regions upon cooling forms one or more laterally grown crystals and wherein each of the second set of irradiated regions upon cooling forms one or more laterally grown crystals that are extended relative to the one or more laterally grown crystals of the first set of irradiated regions In any of the foregoing embodiments, the laser crystallization method employed is sequential lateral solidification.

In any of the foregoing embodiments, each of the first set of irradiated regions overlap each other.

In any of the foregoing embodiments, the number of laser beam pulses in the first scan is less than the amount needed to complete crystallization of the film.

In any of the foregoing embodiments, the number of laser beam pulses in the second scan is an amount needed to complete crystallization of the film.

In any of the foregoing embodiments, the laser crystallization method employed is excimer laser annealing.

In any of the foregoing embodiments, the crystallization method uses from about 10 to about 100 pulses or about 10 to about 40 pulses per unit area.

In any of the foregoing embodiments, the overlap between irradiation regions within each scan is less than 80% or less than 90%.

In any of the foregoing embodiments, the method includes at least 2 continuous scans or includes 2-8 continuous scans.

In any of the foregoing embodiments, the y-direction translation distance is about 10 µm to about 10 mm or about 100 µm to about 2 mm.

In any of the foregoing embodiments, the method includes rotating the film about 180 degrees between scans.

In another aspect, the application relates to a system for processing a film, the system including at least one laser for generating a plurality of laser beam pulses for pulsed laser crystallization of the film, wherein each laser pulse forms a line beam having a length and a width; a film support for positioning a film disposed thereon that is capable of movement in at least two directions; and a controller for providing instructions on controlling the movement of the film support in conjunction with the frequency the laser beam pulses. In any of the foregoing embodiments, controlling the movement of the film support includes continuously irradiating a film, having an x-axis and a y-axis, in a first scan in the x-direction of the film with a plurality of line beam laser pulses to form a first set of irradiated regions; translating the film a distance in the y-direction of the film, wherein the distance is less than the length of the line beam; and continuously irradiating the film in a second scan in the negative x-direction of the film with a sequence of line beam laser pulses to form a second set of irradiated regions, wherein each of the second set of irradiated regions overlaps with a portion of the first set of irradiated regions, and wherein each of the first set and second set of irradiated regions upon cooling forms one or more crystallized regions.

In any of the foregoing embodiments, each line beam laser pulse has a fluence that is sufficient to melt the film throughout its thickness in the first and second set irradiated regions, and wherein each of the first set of irradiated regions are spaced-apart from a each other.

In any of the foregoing embodiments, each of the first set of irradiated regions upon cooling forms one or more laterally grown crystals and wherein each of the second set of irradiated regions upon cooling forms one or more laterally grown crystals that are extended relative to the one or more laterally grown crystals of the first set of irradiated regions In any of the foregoing embodiments, the laser crystallization method employed is sequential lateral solidification.

In any of the foregoing embodiments, each of the first set of irradiated regions overlap each other.

In any of the foregoing embodiments, the number of laser beam pulses in the first scan is less than the amount needed to complete crystallization of the film.

In any of the foregoing embodiments, the number of laser beam pulses in the second scan is an amount needed to complete crystallization of the film.

In any of the foregoing embodiments, the laser crystallization method employed is excimer laser annealing.

In any of the foregoing embodiments, the crystallization method uses from about 10 to about 100 pulses per unit area.

In any of the foregoing embodiments, the crystallization method uses from about 10 to about 40 pulses per unit area.

In any of the foregoing embodiments, the overlap between irradiation regions within each scan is less than 80%.

In any of the foregoing embodiments, the overlap between irradiation regions within each scan is less than 90%.

In any of the foregoing embodiments, the method includes at least 2 continuous scans.

In any of the foregoing embodiments, the method includes 2-8 continuous scans.

In any of the foregoing embodiments, the y-translation distance is about 100 µm to about 10 mm.

In any of the foregoing embodiments, the y-translation distance is about 100 µm to about 2 mm.

In any of the foregoing embodiments, the film is rotated about 180 degrees between scans.

In another aspect, the disclosure relates to a product containing a film processed by the method of the disclosure. In any of the foregoing embodiments, the product is an liquid crystal display screen.

DRAWINGS

The disclosed subject matter is described with reference to the following drawings, which are presented for the purpose of illustration only and which are not intended to be limiting of the invention.

FIG. 3 is a schematic illustration of a line beam pulse varying in width along its length.

FIGS. 4-6 are schematic illustrations of a process according to one or more embodiments of a line scan SLS process in which periodic variations in crystallization quality are addressed, according to one or more embodiments of the present disclosure.

DETAILED DESCRIPTION

Figure 1A:
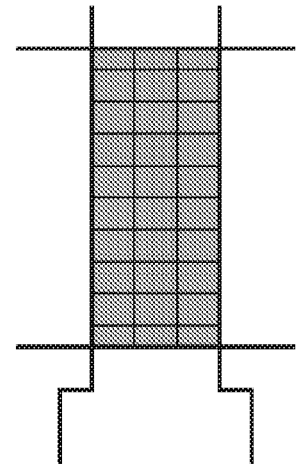
FIG. 1A illustrates a TFT formed within films having crystalline microstructures formed by excimer laser annealing.

In one aspect a thin film having more uniform properties is obtained by line beam irradiation using multiple scans of the laser beam across substantially the same region of the film. Line beam irradiation refers to irradiating a surface of a film using a line beam to induce crystallization in the film. The method may be practiced using any pulsed laser line beam crystallization method. For example, the method may use excimer laser annealing ("ELA") or sequential lateral solidification ("SLS") crystallization methods. Furthermore, it will be apparent from the description that follows that the method is not limited to silicon thin film crystallization and may be practiced for any thin film that re-crystallizes upon melting. For the purposes of discussion that follows, unless specifically noted, the methods may be used for any such material.

The method may also be used on discontinuous films, for example films patterned by lithographic techniques or films deposited only in select regions, e.g., via ink jet printing techniques or shadow-mask printing.

According to one aspect of the disclosure, in each pass of the multi-scan crystallization process, only a portion of the film is irradiated or the number of irradiation pulses per unit area is only a fraction or percentage of the number of irradiations needed to complete the crystallization process. In between each scan, the film is displaced a short distance in the direction perpendicular to the scan direction, e.g., a "transverse shift." A transverse shift can mean a 'sideways' translation, i.e., a translation of the panel in a direction perpendicular to the scan direction. Thus, if the scan direction is arbitrarily designated as a scan in the x-direction, then the film (or the laser beam) is displaced a short distance in the y-direction between scans. The translation distance can be small and is typically on the order of any periodic non-uniformity that arises along the length of the line beam. The translation distance may be as small as 100 microns or even 10 microns but could be as large as several millimeters or more.

When the beam is translated sideways with respect to the sample in between each of the scans, this will result in the (periodic) non-uniformities in the crystallized material arising from variations in laser line beam qualities being shifted with respect to those in the previous scan. As a result, there will not be one "stripe" or crystallized region in which all material was crystallized with the same peak intensity, but rather, there will be a number of stripes in which only a fraction of the material will have experienced such a peak. Devices that are placed within those regions will be less affected by the differences in the stripe properties, provided the dimensions of the devices span at least more than one crystallized region.

Crystalline semiconductor films, such as silicon films, have been processed to provide pixels for liquid crystal displays using various laser processes including ELA and SLS processes. SLS is well suited to process thin films for use in AMLCD devices, as well as active-matrix organic light emitting diode ("AMOLED") devices.

In ELA, a region of the film is irradiated by an excimer laser to partially melt the film, which subsequently crystallizes. The process typically uses a long, relatively narrow beam shape that is continuously advanced over the substrate surface, so that the beam can potentially irradiate the entire semiconductor thin film in a single scan across the surface. ELA produces small-grained polycrystalline films; however, the method often suffers from microstructural non-uniformities, which can be caused by pulse to pulse energy fluctuations and/or non-uniform beam intensity profiles. FIG. 1A illustrates a random microstructure that may be obtained with ELA. The Si film is irradiated multiple times to create the random polycrystalline film with a uniform grain size. This figure, and all subsequent figures, are not drawn to scale, and are intended to be illustrative in nature.

Figure 1B:
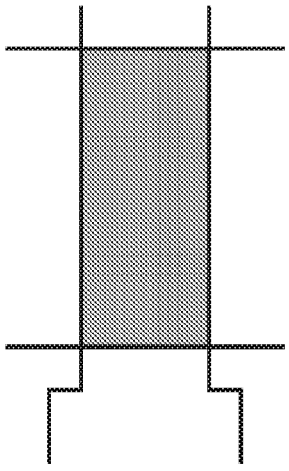
FIGS. 1B-1D illustrate TFTs formed within films having crystalline microstructures formed by sequential lateral crystallization.
Figure 1C:
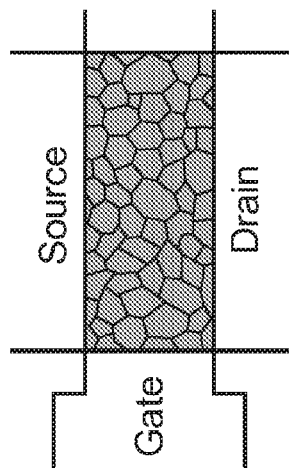
Figure 1D:
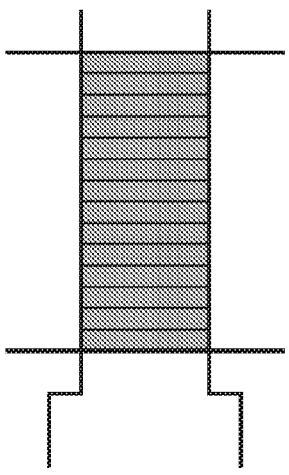

SLS is a pulsed-laser crystallization process that can produce high quality polycrystalline films having large and uniform grains on substrates, including substrates that are intolerant to heat such as glass and plastics. Exemplary SLS processes and systems are described in commonly-owned U.S. Pat. Nos. 6,322,625, 6,368,945, 6,555,449, and 6,573,531, the entire contents of which are incorporated herein by reference. FIGS. 1B-1D illustrate TFTs formed within films having crystalline microstructures formed by SLS.

SLS uses controlled laser pulses to melt a region of an amorphous or polycrystalline thin film on a substrate. The melted regions of film then laterally crystallize into a directionally solidified lateral columnar microstructure or a plurality of location-controlled large single crystal regions. Generally, the melt/crystallization process is sequentially repeated over the surface of a large thin film, with a large number of laser pulses. The processed film on substrate is then used to produce one large display, or even divided to produce multiple displays. FIGS. 1B-1D show schematic drawings of TFTs fabricated within films having different microstructures that can be obtained with SLS. The SLS process can use a long, narrow beam that is continually advanced over the substrate surface, in which case the process is known as line scan SLS ("LS-SLS").

However, conventional ELA and SLS techniques can be limited by variation in the laser pulses from one shot to the next. Each laser pulse used to melt a region of film typically has different energy fluence than other laser pulses used to melt other regions of film. In turn, this can cause slightly different performance in the regions of re-crystallized film across the area of the display. For example, during the sequential irradiation of neighboring regions of the thin film, a first region is irradiated by a first laser pulse having a first energy fluence; a second region is irradiated by a second laser pulse having a second fluence which is at least slightly different from that of the first laser pulse; and a third region is irradiated by a third laser pulse having a third fluence that is at least slightly different from that of the first and second laser pulses, etc. The resulting energy densities experienced by the irradiated and crystallized first, second and third regions of the semiconductor film are all, at least to some extent, different from one another due to the varying fluences of the sequential beam pulses irradiating neighboring regions.

Shaping a laser beam into a very long line-beam that further has uniform width, preferably a top-hat short-axis cross sectional profile, and uniform energy along its length, is challenging. Non-uniformities in the long axis can be more pronounced, and therefore more detrimental. Furthermore, non-uniformities along the long axis may be on a scale that is very clearly visible to the human eye (e.g., a 10% brightness shift over one cm or a few mm). While the eye is reasonably tolerant to random pixel-to-pixel variations and also to very large-scale (10s of cm) and gradual pixel-to-pixel variations, it is not very tolerant to abrupt changes between regions of a display or to small-scale (millimeters to centimeters) gradual fluctuations.

Line-beams often will have non-uniformities in width and energy along the length of the beam, while the cross section often is more rounded or even Gaussian. Non-uniformities along the length of the beam may have a random component, and likely also will have periodic components. These are the result of coherence of the laser light in combination with details of the optical elements (e.g., lens arrays for homogenization). Such non-uniformities will likely translate into unacceptable levels of device uniformities that, in turn, result in non-uniformities of the brightness of the display. This is true for all pixel-based displays, but is especially true for AMOLED devices. For example, an intensity peak in the beam may result in a long stripe of material crystallized at higher energy along the direction of the scan and devices made within that stripe may have different properties from those outside of it.

A line beam SLS process could, for example, use a one dimensional (1D) projection system to generate a long, highly aspected laser beam, typically on the order of 1-100 cm in length, e.g., a "line beam." The length to width aspect ratio may be in the range of about 50 or more, for example up to 100, or 500, or 1000, or 2000, or 10000, or up to about $2 \times 10^5$, or more for example. A thin film that is irradiated by a highly aspected (long) irradiation pattern can be fabricated into TFTs that provide enhanced pixel-to-pixel brightness uniformity because a single scan will crystallize an area large enough for the entire display. The beam length is preferably at least about the size of a single display, e.g., a liquid crystal or OLED display, or a multitude thereof or is preferably about the size of a substrate from which multiple displays can be produced. This is useful because it reduces or eliminates the appearance of any boundaries between irradiated regions of film. Any stitching artifacts that may arise when multiple scans across the film are needed, will generally not be visible within a given liquid crystal or OLED display. The beam length can be suitable for preparing substrates for cell phone displays, e.g., approximately a two inch diagonal for cell phones and ranging up to about a 10-16 inch diagonal for laptop displays (with aspect ratios of 2:3, 3:4 or other common ratios).

One conventional LS-SLS irradiation protocol, referred to herein as "uniform SLS" or "2-shot SLS," may be used to prepare a uniform crystalline film characterized by repeating columns of laterally elongated crystals. The crystallization protocol involves advancing the film by an amount greater than the actual lateral growth length ("LGL"), e.g., $\delta > LGL$, where $\delta$ is the translation distance between pulses, and less than two times the lateral growth length, e.g., $\delta < 2$ LGL. The characteristic lateral growth length refers to the distance of unimpeded lateral growth of a crystalline grain in a single irradiation step under set irradiation conditions and sample configuration. Ultimately, lateral growth is limited by the onset of nucleation in the supercooled liquid Si film. The characteristic lateral growth length therefore is a function of factors such as pulse duration, the amorphous silicon film thickness, and the substrate temperature. The actual lateral growth length may be shorter than the characteristic length if, for example, the growing crystals encounter a solid front originating from other Si portions that were not completely melted throughout their thickness. A typical lateral growth length for 50 nm thick films is approximately up to 2.0 to 3.0 microns, depending on the pulse duration. In the case for 2-shot SLS, the translation distance is more than once, but less than twice the length of the grains which, in the absence of nucleation, corresponds to half the beam width. Uniform crystal growth is described with reference to FIGS. 2A-2D.

Figure 2A:
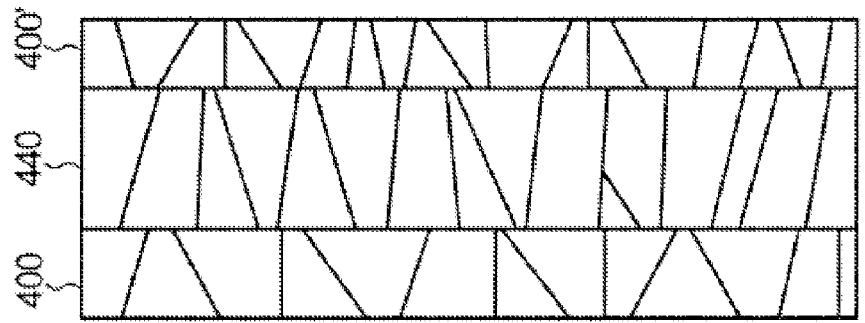
FIGS. 2A-2D illustrate a line beam sequential lateral solidification process to produce uniform crystals according to certain embodiments.

Referring to FIG. 2A, a first irradiation or scan is carried out on a film with a narrow, e.g., less than two times the characteristic LGL, and elongated, e.g., greater than 10 mm and up to or greater than 1000 mm, laser beam pulse having an energy density sufficient to completely melt the film. As a result, the film exposed to the laser beam (shown as region 400 in FIG. 2A), is melted completely and then crystallized. In this case, grains grow laterally from an interface 420 between the un-irradiated region and the melted region. By selecting the laser pulse width so that the molten zone width is less than about two times the characteristic LGL, the grains growing from both solid/melt interfaces collide with one another approximately at the center of the melted region, e.g., at centerline 405, and the lateral growth stops. The two melt fronts collide approximately at the centerline 405 before the temperature of the melt becomes sufficiently low to trigger nucleation.

Figure 2B:
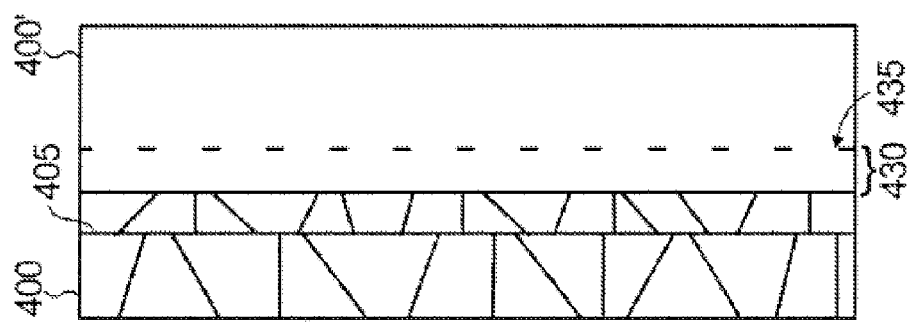
Figure 2C:
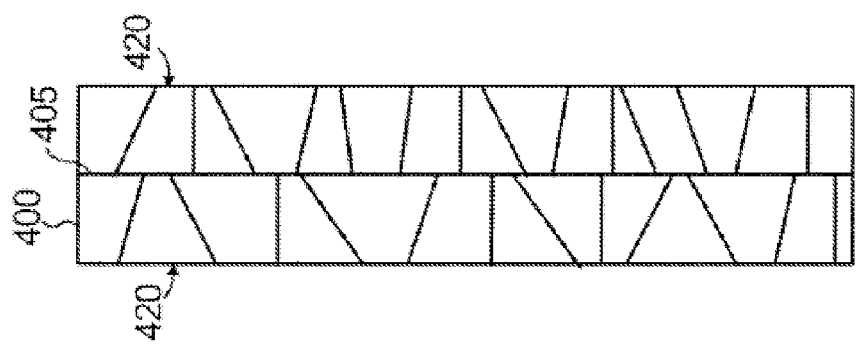
Figure 2D:
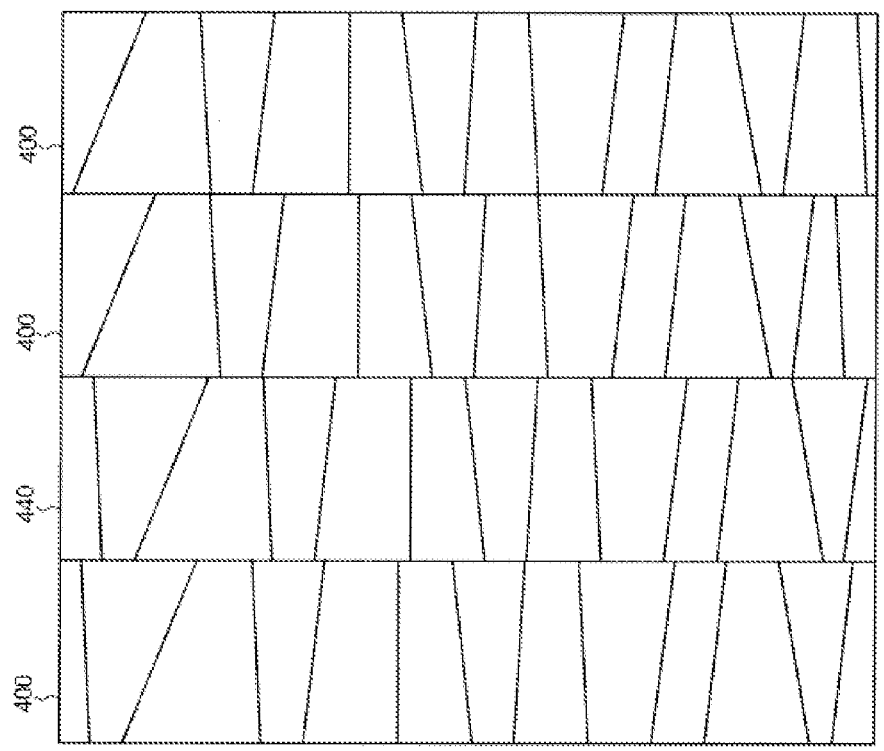

Referring to FIG. 2B, after being displaced by a predetermined distance δ that is at least greater than about one LGL and less than at most two LGL, a second region of the substrate 400' is irradiated with a second laser beam pulse. The displacement of the substrate, δ, is related to the desired degree of overlap of the laser beam pulse. As the displacement of the substrate becomes longer, the degree of overlap becomes less. It is advantageous and preferable to have the overlap degree of the laser beam to be less than about 90% and more than about 10% of the LGL. The overlap region is illustrated by brackets 430 and dashed line 435. The film region 400' exposed to the second laser beam irradiation melts completely and crystallizes. In this case, the grains grown by the first irradiation pulse serve as crystallizing seeds for the lateral growth of the grains grown from the second irradiation pulse. FIG. 2C illustrates a region 440 having crystals that are laterally extended beyond a lateral growth length. Thus, a column of elongated crystals are formed by two laser beam irradiations on average. Because two irradiation pulses are all that is required to form the column of laterally extended crystals, the process is also referred to as a "two shot" process. Irradiation continues across the substrate to create multiple columns of laterally extended crystals. FIG. 2D illustrates the microstructure of the substrate after multiple irradiations and depicts several columns 440 of laterally extended crystals.

It has been observed that there are variations in the width, the shape, and/or the energy density of the line beam along the length of the beam. In some instances the variations are periodic in nature. In some instances, the periodicity of the non-uniformity is greater at one end of the line beam than the other. An exemplary line beam 300 demonstrating periodic variation of the width of the beam in the irradiation pattern is shown in FIG. 3. A similar example could be given for the energy density. The line beam is not drawn to scale and in typical use is much narrower relative to the beam length than shown. The beam length shows regular periodic variation 310, 320 along the length of the beam. In some instances the periodicity can be broad, such as is shown in 310. The periodicity is large enough that it spans several devices on the surface and so the variation is not as noticeable. In contrast, the periodicity in 320 can be much smaller. The periodicity can vary from distances ranging from microns to millimeters, e.g., 100 μm to 5 mm. This periodicity is small enough that it will introduce differences in crystalline quality from device to device. By translating each scan on the order of the periodicity of the variations, the variation in crystalline quality is averaged out so that a more uniform structure is obtained.

Turning now to FIGS. 4-6, a method of crystallization using LS-SLS is described. For an LS-SLS process, in which complete crystallization of a selected region accomplished in "n" scans across the region, only a fraction of the material is fully processed (for example, approximately 1/nth thereof) or only 1/nth of the total irradiation pulses necessary for complete crystallization are used. For example, as shown in FIGS. 4-6, if n=3, for a substrate 500 the in-between-pulse translation distance is three times that in a regular scan process. Each pulse will irradiate a region 510. As a result of this long translation distance, amorphous material 515 will remain in between crystallized regions. The laser beam advances in the direction shown by the arrow indicating scan direction under a stationary laser line beam. In other embodiments, the substrate is stationary and the laser is scanned. Upon the second scan shown in FIG. 5, the in-between pulse translation distance is again three times the regular distance, but now the pulses are offset a length 525 in the x-direction with respect to the first scan so that the pulses overlap to a pre-selected extent with the regions irradiated in the first scan. In addition the substrate is translated a distance 535 in the y-direction. As noted above, the y-translation is selected based on the periodicity of the variation in the laser beam length. Finally turning to FIG. 6, a third scan is performed in which the substrate is scanned in the direction indicated by the arrow in FIG. 6. The substrate is again translated before the scanning begins, with a long translation distance 550 in the y-direction and again with an offset 540 in the x-direction. After three scans, accompanied by the appropriate offsets in the x directions and translations in the y-directions, the entire width of a preselected region 560 of the substrate is irradiated. Upper and lower portions of the substrate are not completely crystallized, leaving a region 560 that is fully crystallized and usable for the preparation of devices as well as more uniform than using conventional methods.

This method relates to crystallizing the entire panel or a portion of the substrate, depending on the length of the beam. If the panel is sufficiently large, multiple crystallized regions within one panel can be made by applying the described method to different areas of the panel.

In other embodiments, the devices are prepared at an angle with respect to the grain boundaries, so that each device intentionally spans several grain boundaries. This tilt angle can be obtained by preparing the devices at an angle with respect to the x-y axes of the substrate. In other embodiments, the tilt can be introduced into the film directly by scanning the substrate at a tilt angle, e.g., the x-y axes of the translation and offset during crystallization are not parallel to the square edges of the substrate. Using a tilted scan direction with respect to the TFT matrix may alleviate the issue somewhat in a sense that non-uniformities will be distributed. See, U.S. application Ser. No. 11/293,655, entitled "Line Scan Sequential Lateral Solidification of Thin Films" filed Dec. 2, 2005, the entire contents of which are hereby incorporated by reference.

The current application also contemplates that a similar approach may be used for floor irradiation techniques using a line beam, for example in the partial melting or the near-complete melting regimes; referred to as line-beam ELA crystallization. Excimer laser annealing technology allows the rapid (on the order of less than a microsecond) melting and re-crystallization of thin film materials. In this technique, the thin film is exposed to many pulses of irradiation, as the narrow laser beam is moved across the surface. Each pulse melts a portion of the film, which re-solidifies and re-crystallizes. For a typical line-beam ELA process that is used in manufacturing of low-temperature polycrystalline silicon (LTPS) based displays, at least some of the pulses are at an energy density sufficient to induce near-complete melting of the film. With near-complete melting it is meant that the film may melt throughout its thickness in many parts of the film but that at least some solid portions remain distributed along the interface with the below layer. From this near-complete melt condition, lateral growth proceeds and crystals having a diameter exceeding the film thickness can be obtained. This near-complete melting regime and the subsequent super-lateral growth phenomenon was described in detail in for example James S. Im et al, Appl. Phys. Lett. 63 (1993) p 1969. The multiple cycles of melt and re-crystallization help to organize the material in the film to induce certain surface roughness and produce a small, but uniformly sized grain structure. The size of the crystals is typically found to be related to the wavelength of the laser light, for example approximately 300 nm grains in a XeCl-gas excimer laser process ($\lambda=308$ nm). Typical ELA processes irradiate a given portion of the film with at least 10 or 20 laser pulses, and in many cases it can be even higher, e.g., from between at least 30 and at least 50 laser pulses.

Figure 7A:
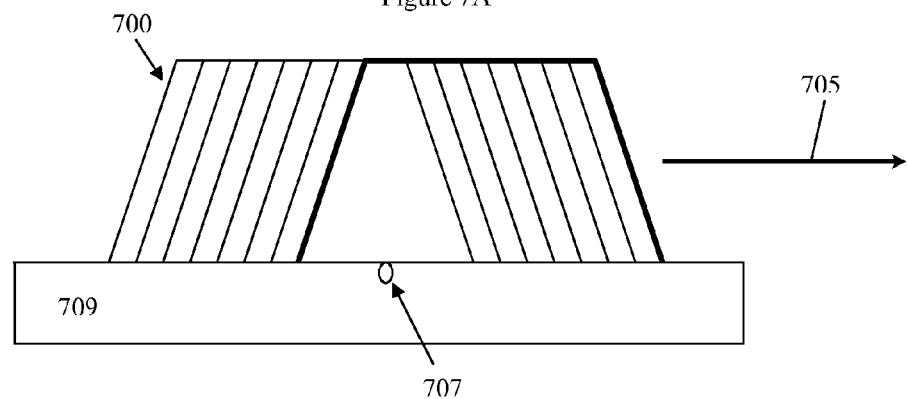
FIGS. 7A-7B are schematic illustrations of a process according to one or more embodiments of an ELA process in which periodic variations in crystallization quality are addressed, according to one or more embodiments of the present disclosure.
Figure 7B:
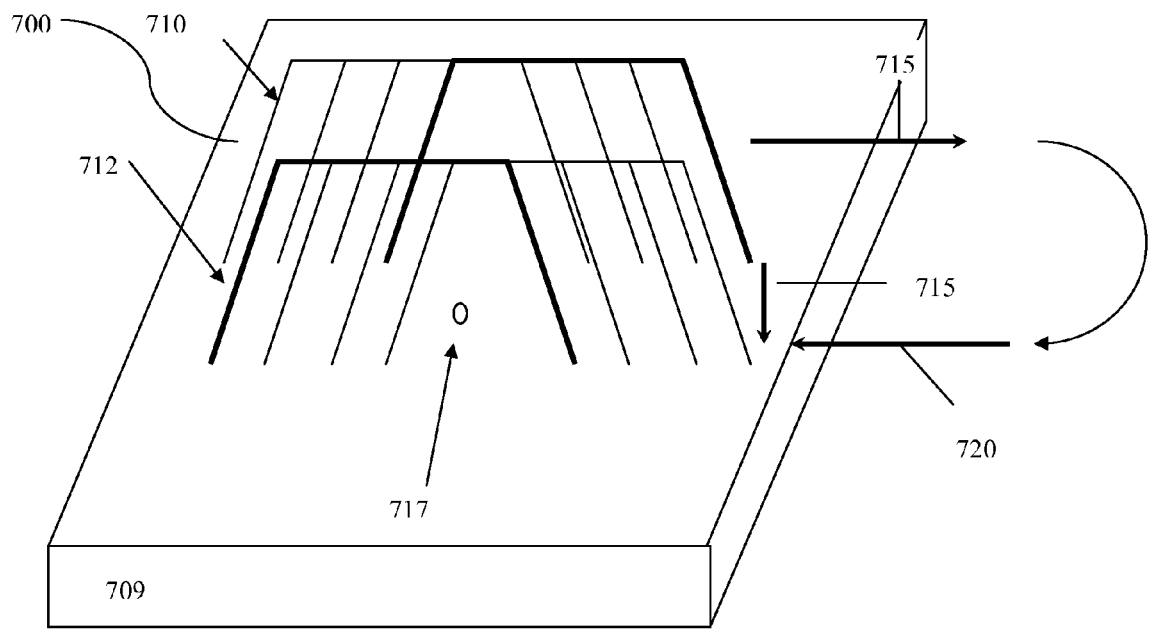

FIG. 7A depicts a conventional ELA single-scan, showing the cross section of the line beam 700 on its short axis as the beam 700 scans a film 709. The beam 700 is advanced in the direction of the arrow 705 and a region 707 of the film 709 can be irradiated with multiple laser pulses as the beam 700 moves across the film 709. FIG. 7B depicts the ELA scheme of the present method. This method incorporated two beam scans, 710, 712 of the substrate: a first scan 710 in the direction of arrow 715, for example, the x-direction and a second scan 712 in the direction of arrow 720, for example, the negative x-direction. The second scan 712 in the direction of arrow 720 also can include a translation 715 of the beam 700 in the direction perpendicular to the direction of arrows, 715 and 720, for example, the y-direction. Notably, while the total number of laser pulses in each individual scan of the present method is less than the number of laser pulses in the conventional ELA methods, because of the reverse scan, region 717 can be irradiated by the same number of laser pulses as region 707 in the conventional ELA method. For example, if the total number of pulses per unit area for the ELA process should be 100, then, if using two ELA scans according to an embodiment of the present method, the first scan would result in 50 pulses per unit area and the second scan would result in 50 pulses per unit area.

In ELA, a line beam is used for the overlapped scanning. The line beam is generally wider than the line beam used for the SLS embodiment. For example, a line beam for the ELA process can have a width of about 300 microns to about 400 microns, while a line scan SLS beam is generally around about three to six microns wide and can be up to eight to ten microns wide. Some SLS line beams can be up to 50 microns in width. For 2-shot SLS, the SLS line beam is required to be narrow enough to avoid nucleation; however, this width can vary based on the pulse duration and the film thickness. While SLS is a controlled lateral growth technique, ELA is essentially a flood irradiation technique where no control of lateral dimensions of the melted regions is necessary and ELA processes, therefore, can use wider beams. Further, the fluences of the ELA beams are selected to not induce complete melting of the film. Therefore, the ELA beam should have a fluence lower by about 5% to 20% of the fluence value that induces complete melting in the given film. The fluence of the beam in the SLS embodiment should be about 10% or about 20% or about 50% or even 80% or 100% higher than the complete melt fluence, in order to guarantee complete melting of the film and induce sufficient lateral growth. The fluence value that induces complete melting is dependent upon the thickness of the film and the duration of the pulse. Further, the ELA beams could have relatively low frequency (compared to the relatively high frequency, i.e., three, four, or six kHz that is desirable for SLS line beams) and have repetition rates of about 300 Hz to about 600 Hz. The lasers used for both ELA and SLS can be high frequency and high power pulsed lasers, with a power of about 300 W to about 600 W and even up to about 1 kW. The high power laser provides sufficient energy per pulse to provide adequate energy density across the length of an irradiated region so that the pulse may melt a film within that region. Other pulsed laser sources, such as solid state lasers, can be used as well and may have lower power, such as 100 W or 200 W and shorter line beams. Diode-pumped solid state lasers (DPSS) are commonly used after frequency doubling with a wavelength of about 532 nm. Their high frequencies (for example 10,000 Hz or 100,000 Hz, or more) can result in very rapid scanning and can be applied to small size devices, such as small displays, other electronics (such as chips for radio frequency identification (RFID)), or electronics integration regions at the perimeter of displays. However, the embodiments are not limited to lasers of any particular frequencies. For example, low frequency lasers, e.g., less than 1 kHz, are also compatible with the irradiation schemes described herein.

For example, the ELA line beam may be created from a relatively low frequency laser source resulting in a relatively wide beam (up to about 400 μm), such as from a JSW crystallization system (The Japanese Steel Works, Ltd., located at Gate City Ohsaki-West Tower, 11-1, Osaki 1-chome, Shinagawa-ku, Tokyo, Japan), or it may be created from a relatively high frequency laser source resulting in a relatively narrow beam (from about 10 μm or less to about 40 μm or more), such as from a TCZ crystallization system (TCZ Pte. Ltd. located at No. 1 Yishun Avenue 7 Singapore 768923).

One of the major non-uniformities arising with ELA is the issue of mura, meaning the light/dark lines in the panel brightness. For example, shot to shot energy density variation can lead in mura perpendicular to the scan direction, while beam non-uniformity along the length of the beam (e.g., through interference) can lead to mura parallel to the scan direction. The latter form of mura may be addressed by subjecting the substrate to multiple ELA scans with in-between transverse translations in the y-direction of the sample with respect to the beam so that the interference features in the beam are shifted with respect of previous scans and the mura pattern is 'broken.' Unlike the SLS process described above, in which portions of the substrate remain un-irradiated between pulses, ELA irradiation uses significant overlap between pulses. Typically for conventional ELA processes, there is at least 90% overlap from one pulse to the next, for example, there is between about 90-99% overlap between pulses. In applying the concept of multiple scan irradiation using x-direction offset and y-direction translation to ELA, the percent overlap is reduced in each scan and multiple scans are conducted over substantially the same area to arrive at the desired level of overlap for the region. For example, rather than doing one scan with 90% overlapping, one can do two scans each with 80% overlapping with a transverse shift in the y-direction in between. Although the overlapping need not be the same in each case, it does have a benefit, because the stage velocity will be the same and stages are manufactured to be especially stable for one particular stage velocity. Also, subsequent scans can be in opposite directions, but they can also be in the same direction wherein the stage needs to return to the start position before conducting the next scan. The laser may be blocked or shut off during reverse stage movement.

While the disclosed method is effective in virtually eliminating the parallel mura, it also can be beneficial for significantly reducing the perpendicular mura. Pulse to pulse variations are not always uncorrelated. One example is that the average pulse energy may slowly drift over a time scale of many pulses (for example 100s of thousands or millions or more). In some systems that are commercially available, this issue is addressed by constantly monitoring the energy density and using this as feedback to compensate for any drift in the pulse energy. If a drift is detected, the pulse energy can be adjusted by stepping the pumping power, (for example, the high voltage in an excimer laser); or by refreshing the lasing medium (for example, adding fresh gas to the gas mixture in an excimer laser); or by adjusting the transmission of an optical attenuator. Such feedback could for instance result in a more abrupt fluctuation of the pulse energy as opposed to a gradual drift. Feedback compensation also may not be effective in correcting for gradual changes that are on a shorter time scale (for example 10s or 100s or 1000s of pulses). Fluctuations thus described may be too large and may result in mura. The multiple scanning, as taught in this disclosure, has as an additional benefit that it also reduces the perpendicular mura by overlapping with a second scan of which the energy fluctuations are uncorrelated compared to previous scans.

In order to achieve the appropriate combination of pulse rate and scan rate, higher stage scan velocities, lower laser repetition rates (i.e., laser frequencies), or a combination thereof is required. However, lower repetition rates will significantly decrease throughput. Fortunately, scan velocities are typically low for line-scan SLS. Therefore, increasing scan velocity may be the best way to achieve the appropriate combination of pulse rate and scan rate. Some reduction in throughput is still encountered as a result of the need to turn around (i.e., reverse the scan direction) for subsequent scans and the time associated with the corresponding deceleration and acceleration. Throughputs with current excimer laser based 2-shot line-scan SLS schemes are higher than those obtained with 2-D projection systems largely as a result of the higher power of the lasers used. Also, the number of turn arounds is smaller for the 2-shot line-scan SLS schemes.

Finally, for the multiple-scan LS-SLS process, what is needed is accurate placement of the pulses. For this, previously, "stage-synchronized" laser control has been implemented and has been found to be very accurate. The accuracy of such a system was demonstrated for stages moving at tens of cm/s, so for slower moving stages accuracy should be not be a problem. For multiple-scan ELA, such stage-synchronized laser control may not be needed because the process is a flood irradiation process and lateral placement of the pulses with respect to previous pulses is less critical. On the other hand, stage-synchronized laser control may be beneficial to get more uniform material by controlled placement of the beam edges (in the short dimension) and better reproducibility from panel to panel. For both embodiments, it is even contemplated that rather than, or in addition to, sideways translations, the stage is rotated about 180 degrees in between scans.

Figure 8:
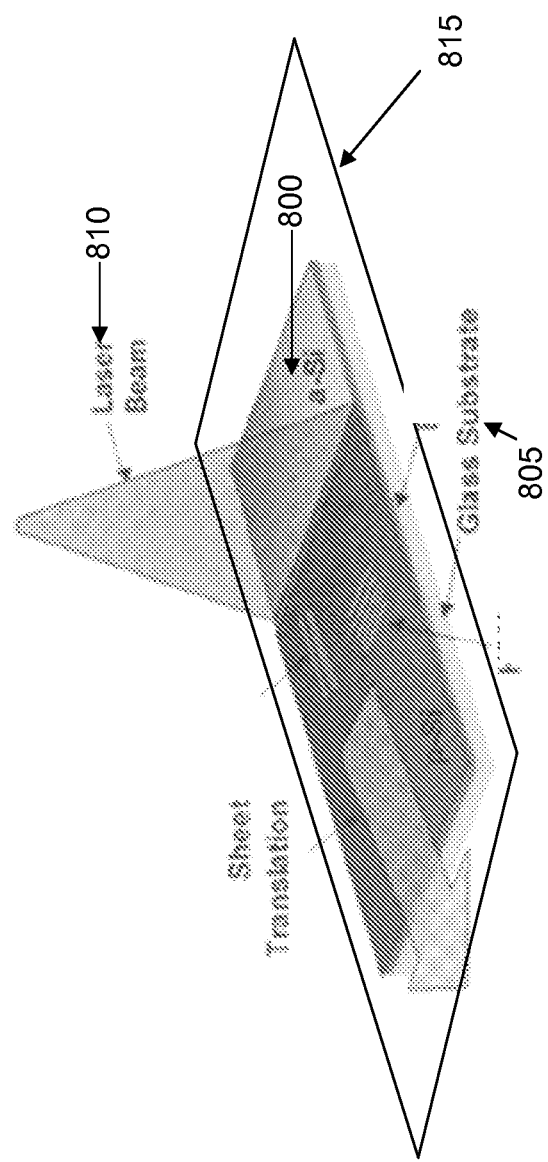
FIG. 8 is a schematic illustration of a system for performing the method of crystallization of a thin film, according to one or more embodiments of the present disclosure

Another aspect of the present disclosure relates to a system for crystallization of thin films. The system, as shown in FIG. 8, can include a film 800 to be crystallized, which can be disposed on a substrate 805, at least one laser for generating one or more laser beam pulses 810 for pulsed laser crystallization of the film, a film support 815 for positioning the film that is capable of movement in at least two directions, and a controller for controlling the movement of the film support in conjunction with the frequency the laser beam pulses.

In the SLS embodiment, the laser beam source is configured such that each laser pulse forms a line beam having a length, a width, and a fluence that is sufficient to melt the film throughout its thickness of the film. In the SLS embodiment, the controller controls the movement of the film support and the frequency of the laser beams as described above with respect to the method.

In the ELA embodiment, the laser beam source is configured to form a line beam having a length and a width. In the ELA embodiment, the line beam is moved at a velocity selected such that each pulse irradiates and melts a portion of the film that overlaps a previously irradiated portion and the total pulses that irradiate a portion of the film is less than the amount needed to complete crystallization. In the ELA embodiment, the controller controls the movement of the film support and the frequency of the laser beams as described above with respect to the method.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

What is claimed is:

1. A method of processing a film, the method comprising:
continuously irradiating a film having an x-axis and a y-axis, in a first scan in the x-direction of the film with a plurality of line beam laser pulses to form a first set of irradiated regions;
translating the film a distance in the y-direction of the film, wherein the distance is less than the length of the line beam; and
continuously irradiating the film in a second scan in the negative x-direction of the film with a sequence of line beam laser pulses to form a second set of irradiated regions,
wherein each of the second set of irradiated regions overlaps with a portion of the first set of irradiated regions, and wherein each of the first and the second set of irradiated regions upon cooling forms one or more crystallized regions.

2. The method of claim 1, wherein each line beam laser pulse has a fluence that is sufficient to melt the film throughout its thickness in the first and second set irradiated regions, and wherein each of the first set of irradiated regions are spaced-apart from each other.

3. The method of claim 2, wherein each of the first set of irradiated regions upon cooling forms one or more laterally grown crystals and wherein each of the second set of irradiated regions upon cooling forms one or more laterally grown crystals that are extended relative to the one or more laterally grown crystals of the first set of irradiated regions.

4. The method of claim 1, wherein the laser crystallization method employed is sequential lateral solidification.

5. The method of claim 1, wherein each of the first set of irradiated regions overlap each other.

6. The method of claim 1, wherein the number of laser beam pulses in the first scan is less than the amount needed to complete crystallization of the film.

7. The method of claim 1, wherein the number of laser beam pulses in the second scan is an amount needed to complete crystallization of the film.

8. The method of claim 1, wherein the laser crystallization method employed is excimer laser annealing.

9. The method of claim 8, wherein the crystallization method uses from about 10 to about 100 pulses per unit area.

10. The method of claim 8, wherein the crystallization method uses from about 10 to about 40 pulses per unit area.

11. The method of claim 8, wherein the overlap between irradiation regions within each scan is less than 80%.

12. The method of claim 8, wherein the overlap between irradiation regions within each scan is less than 90%.

13. The method of claim 1, wherein the method includes at least 2 continuous scans.

14. The method of claim 1, wherein the method includes 2-8 continuous scans.

15. The method of claim 1, wherein the y-direction translation distance is about 10 µm to about 10 mm.

16. The method of claim 1, wherein the y-direction translation distance is about 100 µm to about 2 mm.

17. The method of claim 1 comprising rotating the film about 180 degrees between scans.

* * * * *